(12) United States Patent
Yan

(10) Patent No.: US 9,406,654 B2
(45) Date of Patent: Aug. 2, 2016

(54) PACKAGE FOR HIGH-POWER LED DEVICES

(71) Applicant: LedEngin, Inc., San Jose, CA (US)

(72) Inventor: Xiantao Yan, Palo Alto, CA (US)

(73) Assignee: LedEngin, Inc., San Jose, CA (US)

( * ) Notice: Subject to any disclaimer, the term of this patent is extended or adjusted under 35 U.S.C. 154(b) by 0 days.

(21) Appl. No.: 14/165,372

(22) Filed: Jan. 27, 2014

(65) Prior Publication Data

US 2015/0214194 A1   Jul. 30, 2015

(51) Int. Cl.
| | |
|---|---|
| *H01L 33/00* | (2010.01) |
| *H01L 25/075* | (2006.01) |
| *H01L 33/48* | (2010.01) |
| *H01L 33/62* | (2010.01) |
| *H01L 33/64* | (2010.01) |

(52) U.S. Cl.
CPC .......... *H01L 25/0753* (2013.01); *H01L 33/486* (2013.01); *H01L 33/64* (2013.01); *H01L 33/642* (2013.01); *H01L 33/62* (2013.01); *H01L 33/641* (2013.01); *H01L 33/644* (2013.01); *H01L 2924/0002* (2013.01)

(58) Field of Classification Search
CPC ..... H01L 33/62; H01L 33/486; H01L 33/642; H01L 33/64
See application file for complete search history.

(56) References Cited

U.S. PATENT DOCUMENTS

| | | | |
|---|---|---|---|
| 5,959,316 A | 9/1999 | Lowery | |
| 6,307,160 B1 | 10/2001 | Mei et al. | |
| 6,351,069 B1 | 2/2002 | Lowery et al. | |
| 6,495,964 B1 | 12/2002 | Muthu et al. | |
| 6,608,332 B2 | 8/2003 | Shimizu et al. | |
| 6,614,179 B1 | 9/2003 | Shimizu et al. | |
| 6,642,652 B2 | 11/2003 | Collins, III et al. | |
| 6,680,128 B2 | 1/2004 | Mei | |
| 6,791,116 B2 | 9/2004 | Takahashi et al. | |
| 6,828,170 B2 | 12/2004 | Roberts et al. | |
| 7,064,353 B2 | 6/2006 | Bhat | |
| 7,139,125 B1 | 11/2006 | Mi | |
| 7,156,538 B2 | 1/2007 | Han et al. | |
| 7,157,744 B2 | 1/2007 | Palmteer et al. | |

(Continued)

FOREIGN PATENT DOCUMENTS

| | | |
|---|---|---|
| EP | 2381474 A2 | 10/2011 |
| JP | 2000-349346 | 12/2000 |

(Continued)

OTHER PUBLICATIONS

Kading, "Thermal conduction in metallized silicon-dioxide layers on silicon," Appl. Phys. Lett 65, 1994, pp. 1629-1631.

(Continued)

*Primary Examiner* — Ngan Ngo
(74) *Attorney, Agent, or Firm* — Kilpatrick Townsend & Stockton LLP

(57) ABSTRACT

Packages for LED-based light devices include interface structures that can facilitate heat transfer from the package to a heat sink. The package can include multiple LEDs mounted on a ceramic substrate that provides electrically conductive pathways between the LEDs and metal contact pads at a peripheral region of a top surface of the substrate. A bottom surface of the substrate can be patterned with a plate, such as a thick supporting plate, made of metal and/or other materials with high thermal conductivity, that can be attached to an external heat sink.

18 Claims, 5 Drawing Sheets

(56) References Cited

U.S. PATENT DOCUMENTS

| | | |
|---|---|---|
| 7,168,608 B2 | 1/2007 | Mei |
| 7,199,446 B1 | 4/2007 | Mei et al. |
| 7,264,378 B2 | 9/2007 | Loh |
| 7,465,069 B2 | 12/2008 | Li |
| 7,473,933 B2 | 1/2009 | Yan |
| 7,670,872 B2 | 3/2010 | Yan |
| 7,772,609 B2 | 8/2010 | Yan |
| 8,384,097 B2 | 2/2013 | Yan |
| 2001/0015778 A1 | 8/2001 | Murade |
| 2002/0004251 A1 | 1/2002 | Roberts et al. |
| 2002/0015013 A1 | 2/2002 | Ragle |
| 2002/0163006 A1 | 11/2002 | Yoganandan et al. |
| 2002/0191885 A1 | 12/2002 | Wu et al. |
| 2003/0016899 A1 | 1/2003 | Yan |
| 2003/0086674 A1 | 5/2003 | Yan et al. |
| 2003/0095399 A1 | 5/2003 | Grenda et al. |
| 2003/0116769 A1 | 6/2003 | Song et al. |
| 2003/0122482 A1 | 7/2003 | Yamanaka et al. |
| 2003/0227249 A1 | 12/2003 | Mueller et al. |
| 2003/0230977 A1 | 12/2003 | Epstein |
| 2004/0004437 A1 | 1/2004 | Shimizu et al. |
| 2004/0051111 A1 | 3/2004 | Ota et al. |
| 2004/0079957 A1 | 4/2004 | Andrews et al. |
| 2004/0087165 A1 | 5/2004 | Theiss et al. |
| 2004/0102061 A1 | 5/2004 | Watanabe |
| 2004/0114393 A1 | 6/2004 | Galli |
| 2004/0126918 A1 | 7/2004 | Kurahashi et al. |
| 2004/0150991 A1 | 8/2004 | Ouderkirk et al. |
| 2004/0173810 A1 | 9/2004 | Lin et al. |
| 2004/0201025 A1 | 10/2004 | Barnett |
| 2004/0208210 A1* | 10/2004 | Inoguchi ..................... 372/36 |
| 2004/0257496 A1 | 12/2004 | Sonoda |
| 2005/0035364 A1 | 2/2005 | Sano et al. |
| 2005/0093146 A1 | 5/2005 | Sakano |
| 2005/0127281 A1 | 6/2005 | Zheng et al. |
| 2005/0128751 A1 | 6/2005 | Roberge |
| 2005/0145872 A1 | 7/2005 | Fang et al. |
| 2005/0179376 A1 | 8/2005 | Fung et al. |
| 2005/0199900 A1 | 9/2005 | Lin et al. |
| 2005/0224830 A1 | 10/2005 | Blonder et al. |
| 2005/0253242 A1 | 11/2005 | Costello et al. |
| 2005/0286131 A1 | 12/2005 | Saxena et al. |
| 2006/0012299 A1 | 1/2006 | Suehiro et al. |
| 2006/0063287 A1 | 3/2006 | Andrews |
| 2006/0082296 A1 | 4/2006 | Chua et al. |
| 2006/0082679 A1 | 4/2006 | Chua et al. |
| 2006/0091416 A1 | 5/2006 | Yan |
| 2006/0091788 A1 | 5/2006 | Yan |
| 2006/0097385 A1 | 5/2006 | Negley |
| 2006/0170332 A1 | 8/2006 | Tamaki et al. |
| 2006/0284209 A1 | 12/2006 | Kim et al. |
| 2007/0023769 A1 | 2/2007 | Nishimoto et al. |
| 2007/0081360 A1 | 4/2007 | Bailey et al. |
| 2007/0139437 A1 | 6/2007 | Boroson et al. |
| 2007/0170449 A1 | 7/2007 | Anandan |
| 2007/0194341 A1 | 8/2007 | Chang et al. |
| 2007/0241357 A1 | 10/2007 | Yan |
| 2008/0083931 A1* | 4/2008 | Bando et al. ..................... 257/99 |
| 2008/0149962 A1 | 6/2008 | Kim |
| 2008/0308825 A1 | 12/2008 | Chakraborty et al. |
| 2009/0316409 A1 | 12/2009 | Kim |
| 2010/0259930 A1* | 10/2010 | Yan ............................. 362/235 |
| 2011/0012512 A1 | 1/2011 | Young et al. |
| 2011/0198653 A1* | 8/2011 | Cho .............................. 257/98 |
| 2011/0248289 A1 | 10/2011 | Hsieh et al. |
| 2011/0291135 A1 | 12/2011 | Hsieh |
| 2012/0286669 A1 | 11/2012 | Yan et al. |
| 2013/0026511 A1 | 1/2013 | Yeh et al. |
| 2014/0209939 A1 | 7/2014 | Yan et al. |

FOREIGN PATENT DOCUMENTS

| | | |
|---|---|---|
| JP | 2000-349347 | 12/2000 |
| JP | 2001-057445 | 2/2001 |
| JP | 2002185046 | 6/2002 |
| JP | 2004241704 | 8/2004 |
| JP | 2004-253404 | 9/2004 |
| KR | 10-2011-0118523 A | 10/2011 |
| KR | 10-2014-0121214 A | 10/2014 |

OTHER PUBLICATIONS

Yan, Xiantao, et al., "Two Test Specimens for Determining the Interfacial Fracture Toughness in Flip-Chip Assemblies," Transactions of the ASME, vol. 120, Jun. 1998, p. 150.

Yan, Xiantao, "Analysis Based Design Guidelines for Metal Runner and Passivation Layers in IC Packaging," Delphi Automotive Systems Analytical Engineering Conference, May 2000, p. 1.

"Solvent Soluble Polyimide with High Transparency and High Tg: HOP-400, 500", Hitachi Cable Review, Aug. 2003, No. 22, p. 78.

Office Action mailed Nov. 20, 2015 in U.S. Appl. No. 14/231,406, 19 pages.

International Search Report and Written Opinion mailed Feb. 29, 2016 in PCT/US2015/062760, 11 pages.

* cited by examiner

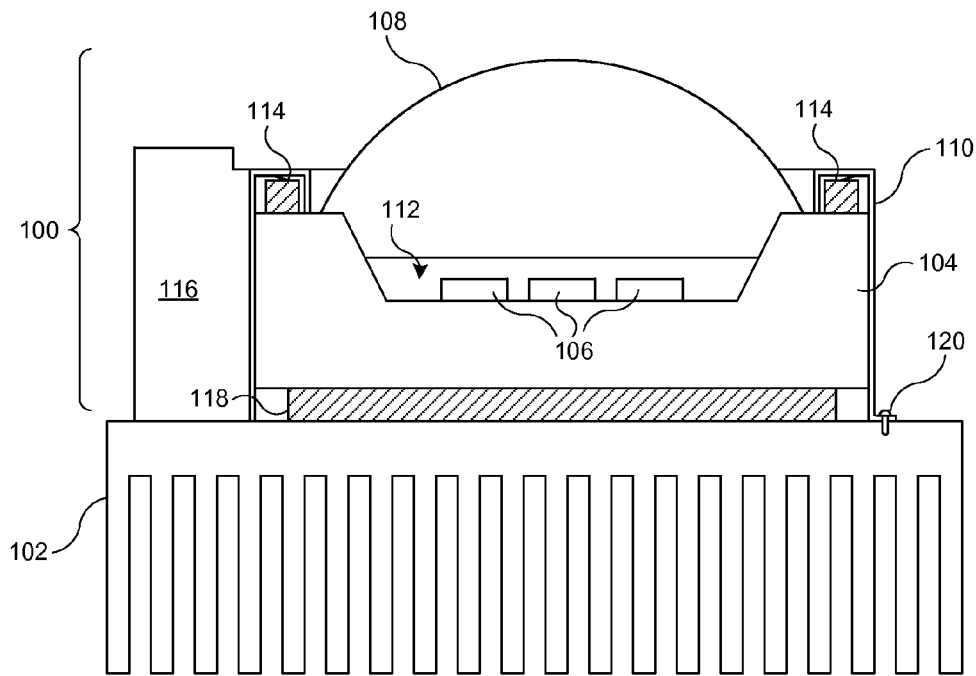
FIG. 1A
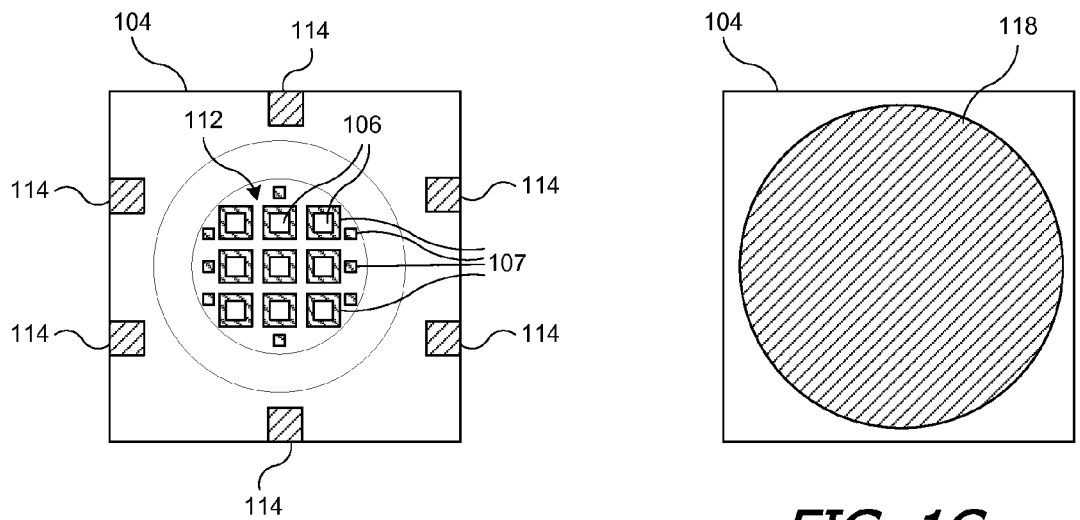
FIG. 1B
FIG. 1C

PACKAGE FOR HIGH-POWER LED DEVICES

BACKGROUND

The present disclosure relates generally to light devices incorporating LEDs and in particular to a package for a high-power LED device.

A light-emitting diode (LED) is a semiconductor device that produces light when an electric current is passed through it. LEDs have many advantages over conventional lighting sources, including compact size, improved energy efficiency, longer life, and higher reliability. LEDs have traditionally been used in applications such as indicator lights. More recently, LEDs also have become an important alternative light source for various applications where incandescent and fluorescent lamps have traditionally dominated. For such applications, high brightness (and therefore high operating current) is generally desirable.

To provide an operational lamp, one or more LEDs are typically mounted on a an electrically insulating substrate (e.g., ceramic) that can be patterned with conductive pathways to supply electrical current to the LEDs. For example, LEDs can be wire-bonded to the conductive pathways using metal pads disposed on an upper surface of the substrate. The LEDs and portions (or all) of the substrate are usually covered with one or more layers of optically transparent and/or wavelength-shifting materials, in some cases including a primary lens to direct the exiting light. The substrate is mounted on and electrically connected to a metal-core printed circuit board (MCPCB). The MCPCB provides electrical contacts and mechanical couplings. This combination of LEDs, substrate, MCPCB, and optical materials is sometimes referred to as a "package." A package can be incorporated into a lamp or other lighting apparatus that may include additional components such as a secondary lens, heat sink, mechanical and/or electrical connections allowing installation into a light fixture, and so on.

SUMMARY

In operation, an LED package generates heat, partly due to the LEDs themselves and partly due to the resistivity of the electrical paths connected through the MCPCB and substrate to the LEDs. A buildup of heat within the package can adversely affect device performance and/or cause device failure. Accordingly, packages that can prevent excessive heat buildup during device operation are desirable.

Certain embodiments of the present invention provide interface structures that can facilitate heat transfer from an LED package to a heat sink. The package can include a number of LEDs (e.g., four or more, although no particular number is required) mounted on a ceramic substrate that provides electrically conductive pathways to the LEDs. In some embodiments, a peripheral region of a top surface of the substrate is patterned with contact pads that can be used to electrically connect the substrate (directly or indirectly) to a power source, while a bottom surface of the substrate is patterned with a thick, thermally conductive supporting plate (which can be made of metal and/or other materials with high thermal conductivity) that can be attached to an external heat sink. The peripheral contact pads on the top surface and the supporting plate on the bottom surface can be roughly of equal thickness to help balance thermal stresses on the substrate and prevent deformation or warping.

Certain aspects of the invention relate to light device packages. In some embodiments, a package can include a substrate (e.g., a square substrate). The substrate can have or more light-emitting diode (LED) chips disposed on a top surface. A thick supporting plate (e.g., a circular plate made of metal such as copper and/or other materials with high thermal conductivity) can be disposed over at least a portion of the bottom surface of the substrate, and thick contact pads (e.g., made of metal and/or other electrically conductive materials) can be disposed on the top surface of the substrate. The thick contact pad can be electrically connected to the one or more light-emitting diode chips. For example, the substrate can include one or more ceramic layers, and metal traces can be disposed on and/or between the layers.

The bottom supporting plate and the thick contact pads can each include an interface layer made up of sub-layers of different metals, including, e.g., a tungsten sub-layer and a nickel sub-layer, a gold sub-layer, and/or a silver sub-layer. The interface layer can be disposed directly on the surface of the substrate and a layer of copper or other metal (which can be considerably thicker than the interface layer) can be disposed directly on the interface layer. In some embodiments, the bottom supporting plate can have grooves on its surface that terminate at a peripheral edge of the plate.

In some embodiments, a cover member can be disposed over the top surface of the substrate. The cover member can have a housing made, e.g., of an electrically insulating material such as plastic, with an opening to emit light from the one or more LED chips and a metal contact attached to an underside of the housing. The metal contact can be arranged such that a portion of the metal contact is held in contact with the thick contact pad on the top surface of the substrate by a spring force. An external electrical connector can be disposed at a peripheral edge of the housing, and the metal contact can be electrically connected to the electrical connector.

In some embodiments, the light device package can be incorporated into an assembly that includes a heat sink. For example, the supporting plate on the bottom surface of the substrate can be secured to the heat sink, e.g., using thermally conductive adhesives or solder. The cover member can be secured to the heat sink using fasteners (e.g., screws, nails, pins, clamps, adhesives, etc.) at the peripheral edge of the housing.

The following detailed description together with the accompanying drawings will provide a better understanding of the nature and advantages of the present invention.

BRIEF DESCRIPTION OF THE DRAWINGS

FIGS. 1A-1C show an LED package according to an embodiment of the present invention. FIG. 1A is a simplified cross-sectional side view of a package attached to a heat sink; FIG. 1B is a simplified top view of the package substrate; and FIG. 1C is a simplified bottom view of the package substrate.

FIGS. 3A and 3B are, respectively, simplified top and bottom views; FIG. 3C is a simplified bottom view with a cutaway portion.

FIG. 4A is a view with a cover partially lifted off the substrate; FIG. 4B is a view with the cover placed down onto the substrate.

DETAILED DESCRIPTION

Figure 2:
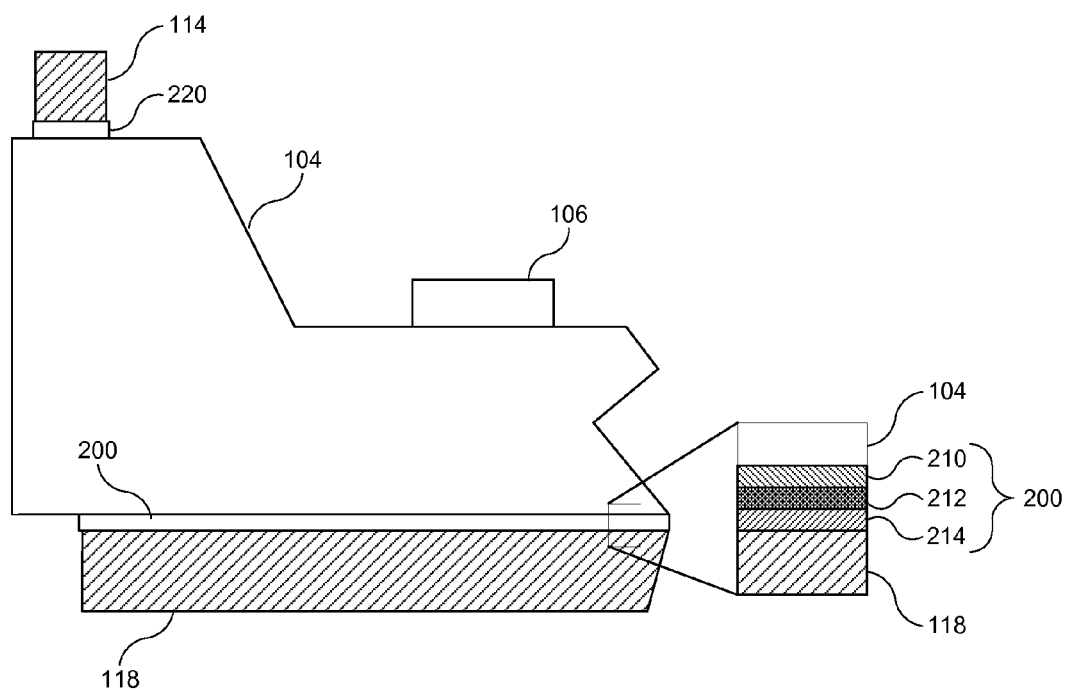
FIG. 2 shows a detail of an interface layer between a substrate and a bottom supporting plate according to an embodiment of the present invention.

Certain embodiments of the present invention provide interface structures that can facilitate heat transfer from an LED package to a heat sink. The package can include a number of LEDs (typically four or more, although no particular number is required) mounted on a ceramic substrate that provides electrically conductive pathways to the LEDs. In some embodiments, a peripheral region of a top surface of the substrate is patterned with metal contact pads that can be used to electrically connect the substrate (directly or indirectly) to a power source, while a bottom surface of the substrate is patterned with a thick supporting plate (which can be made of metal and/or other materials with high thermal conductivity) that can be attached to an external heat sink. The peripheral contact pads on the top surface and the supporting plate on the bottom surface can be roughly of equal thickness to help balance thermal stresses on the substrate and prevent deformation.

FIG. 1A is a simplified side cross-sectional view of an LED package 100 attached to a heat sink 102 according to an embodiment of the present invention. Package 100 includes a substrate 104, LEDs 106, a primary lens 108, and a cover 110. FIG. 1B is a simplified top view of package 100 with cover 110 and primary lens 108 removed. FIG. 1C is a simplified bottom view of package 100.

LEDs 106 can be light-emitting diodes that generate light of a particular frequency. Any type, color, or combination of LEDs can be used. For example, LEDs 106 can be blue LEDs (i.e., LEDs that emit light in the blue region of the electromagnetic spectrum) coated with yellow phosphors to produce white light. LEDs 106 can also include red LEDs, green LEDs, amber LEDs, blue LEDs, ultraviolet LEDs, infrared LEDs, and/or any other type of LED, with or without phosphor or other wavelength-shifting coatings.

Substrate 104 can be a single-layer or multi-layer ceramic substrate. In some embodiments, substrate 104 is formed from multiple layers of a ceramic material (e.g., alumina) that are patterned with metal traces (not shown), then fused together. Vias can be formed to connect metal traces at different layers. In some embodiments, the metal traces are arranged to provide separate electrical connections to different ones of LEDs 106, thereby allowing separate control of different LEDs, e.g., to adjust the color of emitted light.

In some embodiments, LEDs 106 are disposed within a circular recess region 112 on the top side of substrate 104. The top surface of substrate 104 within recess region 112 can be patterned with metal contact pads 107 (e.g., as shown in FIG. 1B) to provide electrical connections to LEDs 106. In some embodiments, LEDs 106 can have wire-bonding contacts (not shown) on the top surface and can be electrically connected to contact pads 107 by wire-bonding. In some embodiments, one or more electrical contacts for an LED 106 may be on the bottom surface of LED 106, allowing LED 106 to be electrically connected to the pad 107 on which it is placed. The number and arrangement of metal contact pads 107 and LEDs 106 can be varied as desired.

In some embodiments, substrate 104 can be similar to substrates described in U.S. Patent Application Publication No. 2010/0259930. Other types of substrates can also be used. The dimensions of substrate 104 can be varied as desired, e.g., depending in part on the number and arrangement of LEDs 106. For example, substrate 104 can be square with dimensions of 0.7-5.0 cm on a side (e.g., 0.9 cm for one example of a substrate with sixteen LEDs 106) and a thickness of 0.5-2.0 mm (e.g., 1.0 mm for one example of a substrate with 16 LEDs 106).

Primary lens 108 can be used to focus or direct light generated by LEDs 106. In some embodiments, the lower portion of lens 108 is shaped to fit into and partially fill recess region 112 as shown in FIG. 1A. The remainder of recess region 112 can be filled with air or with an optically transparent material, e.g., approximately matching an index of refraction of lens 108. In some embodiments, one or more secondary lenses (not shown), such as a total internal reflection lens, can be used to further shape the light output from package 100.

The bottom surface of substrate 104 can be partially covered by a supporting plate 118 (shown in FIGS. 1A and 1C), which can be made of copper and/or other thermally conductive metals and/or other thermally conductive materials (e.g., graphite or graphene). This plate, which can be circular or other shapes, serves to provide mechanical support for substrate 104 (e.g., to prevent bending or warping) and to spread the heat generated during operation of LEDs 106 over a larger area, facilitating heat transfer to a heat sink 102 without an intervening MCPCB. Supporting plate 118 can be made entirely or partially of copper or another metal or another material with high thermal conductivity, such as graphite. The thickness of supporting plate 118 can be chosen to provide mechanical support for substrate 104. For example, the thickness can be about 25-40 µm. The diameter (or transverse dimensions) of supporting plate 118 can be made as large or almost as large as the transverse dimensions of substrate 104.

In some embodiments, part or all of the bottom surface of substrate 104 can be covered with thin sub-layers of other metals, to provide an interface layer that reduces thermal stress between supporting plate 118 and the ceramic material of substrate 104. FIG. 2 shows a detail of an interface layer 200 according to an embodiment of the present invention. As shown in inset 204, interface layer 200 includes a tungsten (W) sub-layer 210 nearest to substrate 104, a nickel (Ni) sub-layer 212, and a gold (Au) sub-layer 214. These sub-layers can each be from a few angstroms up to a few microns or more in thickness, and different sub-layers can have different thicknesses. In one example, the W sub-layer is in the approximate range 1.5-4.5 µm (e.g., about 3.0 µm), the Ni sub-layer in the approximate range 1.2-8.9 µm (e.g., about 3.0 µm), and the Au sub-layer in the approximate range 0.2-0.35 µm (e.g., about 0.3 µm). In other embodiments, more or fewer sub-layers can be used. For example, a silver (Ag) sub-layer with a thickness the approximate range 2.0-4.5 µm (e.g., about 4.0 µm) can be applied over Au sub-layer 214.

To facilitate electrical connections, substrate 104 can have metal contact pads 114 disposed in a peripheral region surrounding recess region 112, as shown in FIGS. 1A and 1B. Peripheral contact pads 114 can be made of copper or other electrically conductive metals. In some embodiments, metal contact pads 114 are made of the same metal and have approximately the same thickness as bottom supporting plate 118. In addition, as shown in FIG. 2, an interface layer 220 similar or identical to interface layer 200 can be provided between top surface of substrate 104 and metal contact pads 114. This arrangement can help to balance thermal stress between the top and bottom surfaces, thereby reducing or preventing warping of substrate 104.

Substrate 104 can provide electrical pathways connecting peripheral contact pads 114 to LED contact pads 107. For example, as described above, metal traces can be disposed on and/or between layers of substrate 104, and these traces can provide the electrically conductive pathways. Accordingly, peripheral contact pads 114 be used to provide operating power to LEDs 106. As described below with reference to FIGS. 3A-3C, an electrical connection from an external power source to metal contact pads 114 can be facilitated by cover 110, which can include an electrical connector 116.

As shown in FIG. 1A, package 100 can be attached directly to a heat sink, without an intervening MCPCB or other structure. In some embodiments, attachment can include bonding bottom supporting plate 118 to heat sink 102 using a thermally conductive adhesive (e.g., tape or glue). In other embodiments, solder bonding can be used. Cover 110 can also be attached to heat sink 102, e.g., using screws 120, pins, clamps or other fasteners. Eliminating the MCPCB between substrate 104 and heat sink 102 can improve heat transfer from package 100, allowing operation at higher power (and therefore higher brightness).

Figure 3A:
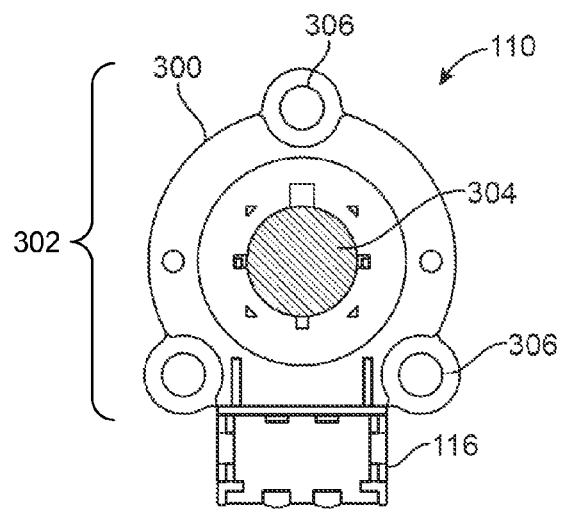
FIGS. 3A-3C show a cover for an LED package according to an embodiment of the present invention.
Figure 3B:
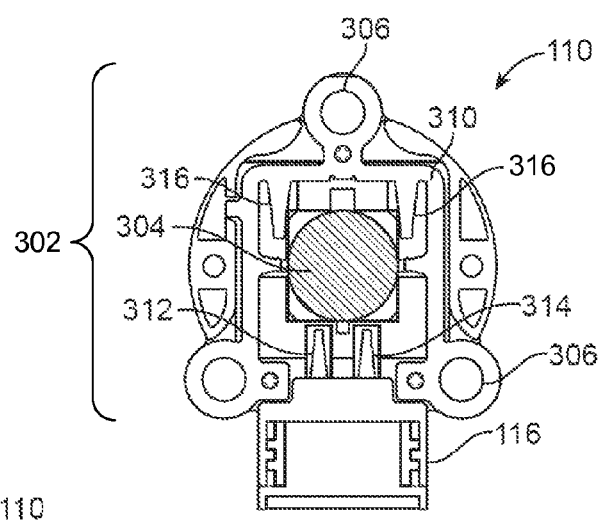
Figure 3C:
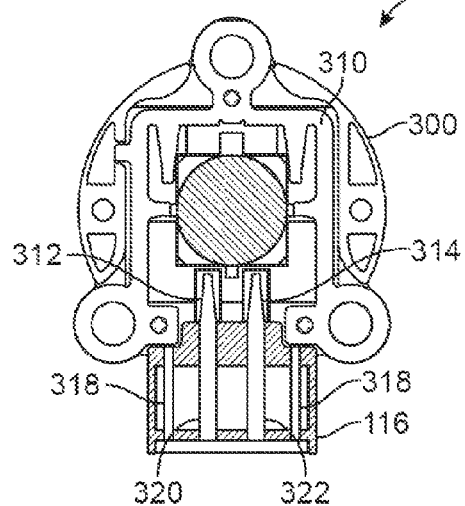

Cover 110, which can include an electrical connector 116, can provide electrical connectivity to substrate 104, as well as protection from the elements. FIGS. 3A and 3B are, respectively, simplified top and bottom views showing cover 110 according to an embodiment of the present invention; FIG. 3C is a bottom view with a cutaway of connector 116. Cover 110 has a housing 300, which can be made of plastic or other electrically insulating material. Housing 300 has a main body section 302 that can be shaped to cover substrate 104, with a central opening 304 to accommodate lens 108. Peripheral holes 306 can be provided for attaching cover 110 to heat sink 102 or to another supporting structure. Connector 116 is disposed at one side of main body section 302.

As shown in FIGS. 3B and 3C, the underside of housing 300 can hold a metal frame 310 and additional metal leads 312, 314. Metal frame 310 can be shaped to include projecting leads 316 as shown. As shown in FIG. 3C, metal frame 310 and metal leads 312, 314 can be electrically connected into connector 116, which provides external electrical contacts (e.g., pins). For example, metal frame 310 can be connected to ground contacts 318 in connector 116 while metal leads 312, 314 are connected to one or more power contacts 320, 322 in connector 116. Connector 116 can include, for example, a receptacle connector into which a complementary plug connector can be inserted, a plug connector that can be inserted into a corresponding receptacle connector, or a set of connector terminals to which individual electrical wires can be connected. Those skilled in the art will recognize that a variety of connector types and form factors can be used; accordingly, a detailed description of connector geometry is omitted.

Figure 4A:
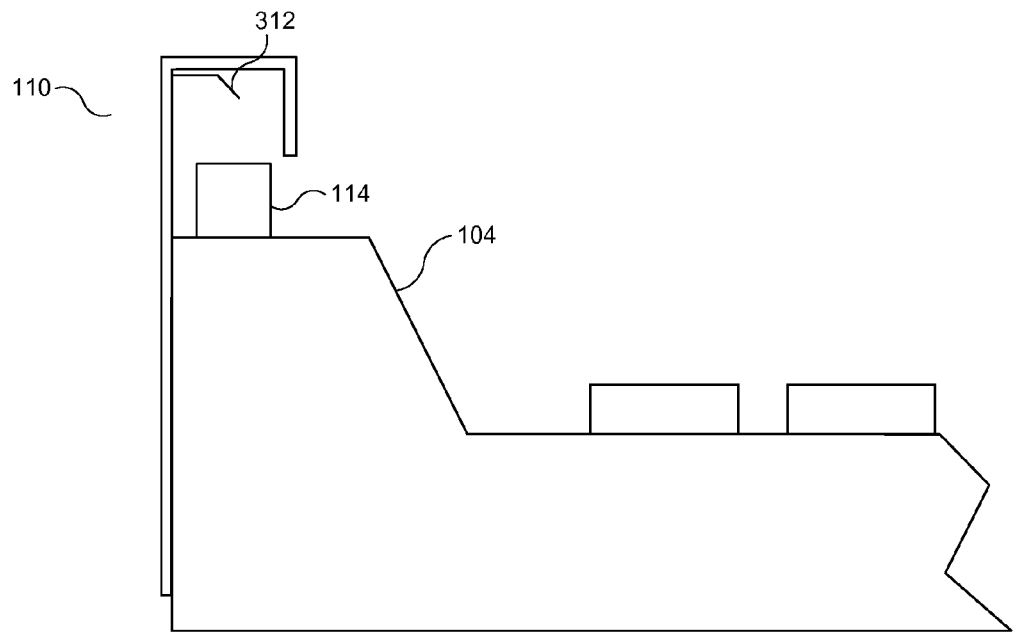
FIGS. 4A and 4B, show simplified partial side views of the package of FIGS. 1A-1C.
Figure 4B:
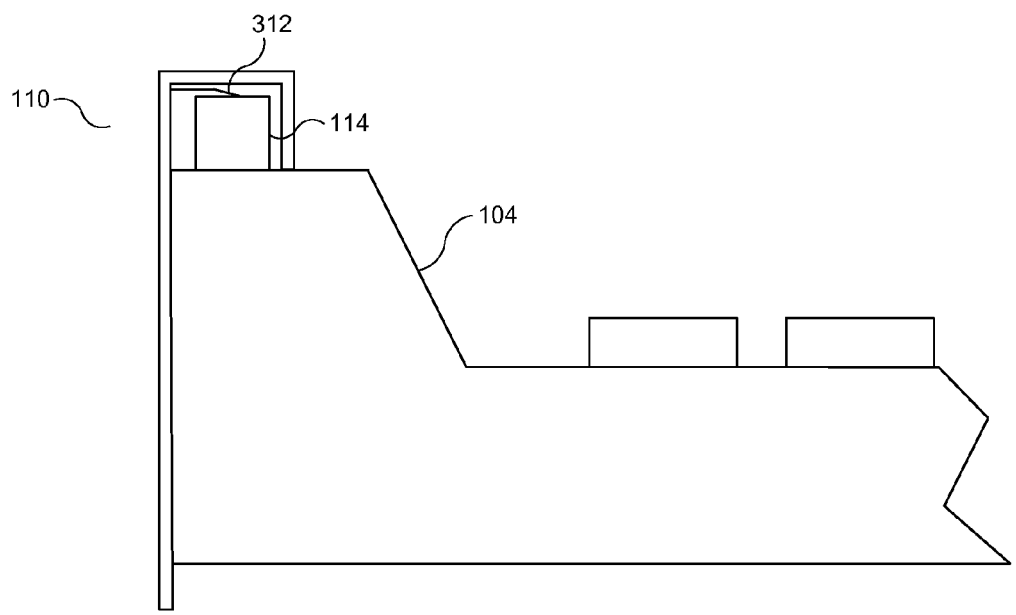

Projecting leads 316 of frame 310 as well as metal leads 312, 314 can each be bent downward to provide a spring-force contact with peripheral contact pads 114 (FIGS. 1A-1B). One such embodiment is illustrated in FIGS. 4A and 4B, which show simplified partial side views of package 100 of FIG. 1A. Shown in FIG. 4A is an arrangement where cover 110 is lifted off substrate 104. Metal lead 312 projects downward from cover 110 as shown. FIG. 4B shows a corresponding arrangement when cover 110 is placed down onto substrate 104. Metal lead 312 is deflected upward, and the spring force keeps metal lead 312 in contact with contact pad 114. While one lead is shown, it is to be understood that other metal leads of cover 110 shown in FIG. 3B can be similarly shaped. In other embodiments, other techniques can be used to provide electrical connections between the substrate and the cover.

Figure 5:
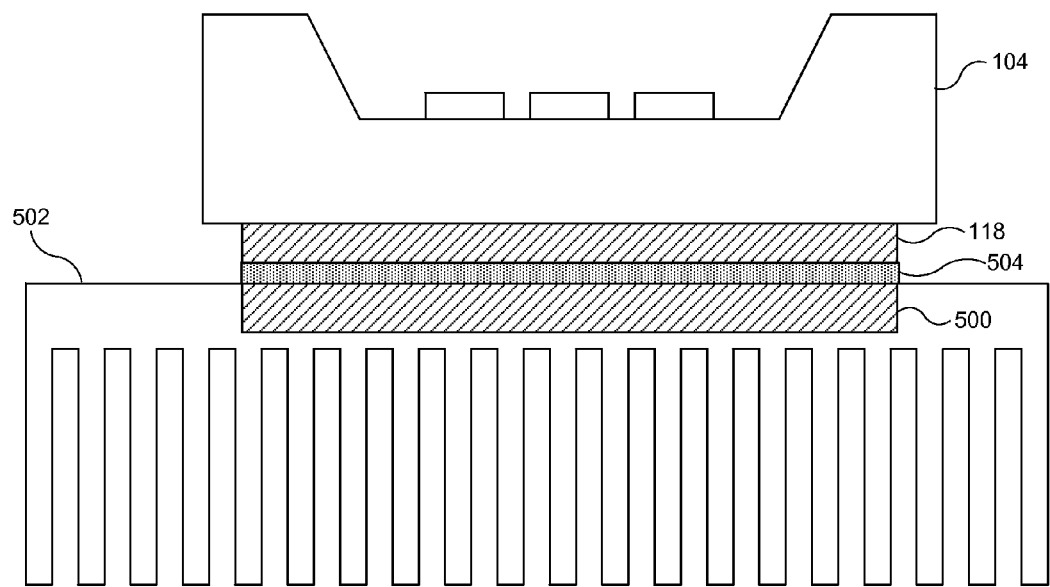
FIG. 5 is a simplified side view of a package solder bonded to a heat sink according to an embodiment of the present invention.

As noted above, in some embodiments, bottom supporting plate 118 can be solder bonded to a heat sink 102. FIG. 5 is a simplified side view showing one such configuration according to an embodiment of the present invention. As shown, bottom supporting plate 118 of substrate 104 is bonded to a corresponding metal insert 500 of a heat sink 502 using solder 504. In some embodiments, bottom supporting plate 118 and metal insert 500 can be made of the same material, e.g., copper. In some embodiments, metal insert 500 can incorporate other materials with high thermal conductivity, such as graphite or graphene, in addition to or instead of metal.

Figure 6:
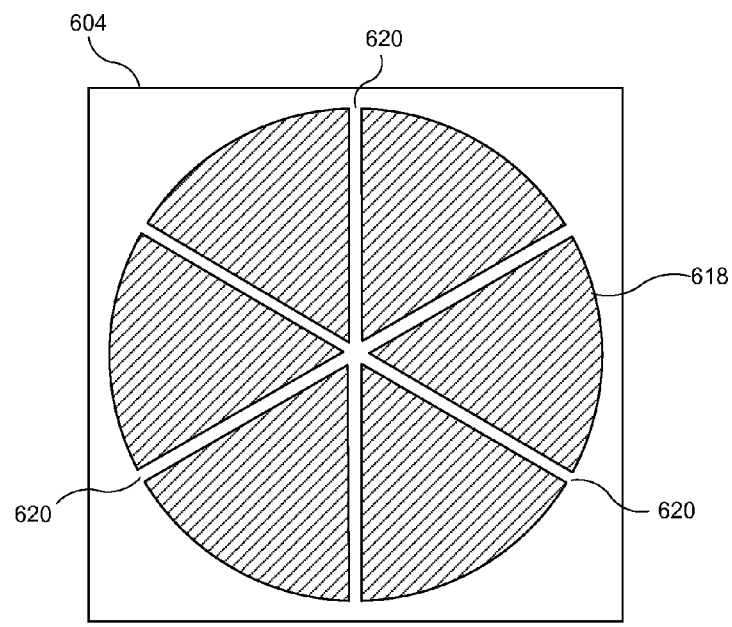
FIG. 6 is a simplified bottom view of a substrate with a grooved bottom supporting plate according to an embodiment of the present invention.

In this arrangement, it is desirable to reduce or prevent the occurrence of solder voids in solder 504, which can interfere with heat transfer and cause local "hot spots" in bottom supporting plate 118 and/or substrate 104. In some embodiments, solder voids can be reduced or eliminated by providing grooves in bottom supporting plate 118. FIG. 6 is a bottom view of a substrate 604 according to an embodiment of the present invention. Substrate 604 can be generally similar to substrate 104 described above.

As shown, the bottom surface of substrate 604 is largely covered by a supporting plate 618 (e.g., a copper plate) that has grooves 620 formed therein. In this example, grooves 620 extend all the way across the diameter of supporting plate 618. In other embodiments, other groove patterns can be used, including curved patterns and patterns in which the grooves do not extend all the way to the center of supporting plate 618. Grooves 620 can provide a channel for air to escape during the soldering process, thereby reducing the number and/or size of solder voids in solder layer 504 of FIG. 5.

The number and dimensions of grooves 620 can be selected to provide one or more paths for air to escape. In some embodiments, grooves 620 can have a depth equal to or less than the thickness of supporting plate 618. For example, in one embodiment, grooves 620 can be approximately 0.23 mm wide and 0.07 mm deep; width and depth can be varied. In some embodiments, the number and width of grooves 620 can be chosen such the area occupied by the grooves is 15% or less of the area of plate 618.

Grooves 620 can be formed by various processes, e.g., cutting or stripping away metal after plate 618 is formed on or attached to the bottom of substrate 604.

Where thermal adhesives are used instead of solder to attach package 100 to a heat sink, it may be useful to use a bottom supporting plate that does not have grooves. Accordingly, it is to be understood that bottom supporting plate 118 of FIG. 1 can, but need not, have grooves as shown in FIG. 6. In some embodiments where solder is used, grooves can be provided in the heat sink (e.g., in metal insert 500 shown in FIG. 5) in addition to or instead of bottom supporting plate 118.

In some embodiments, bottom supporting plate 118 provides efficient heat transfer from substrate 104. The thickness of bottom supporting plate 118 can also provide mechanical support that can facilitate attaching substrate 104 directly to a heat sink without an intervening MCPCB, even if the surface of the heat sink is not particularly flat or smooth.

Previous packages have relied on a metal-core printed circuit board (MCPCB) disposed under the ceramic substrate to provide mechanical support and external electrical connections, as well as heat spreading. Embodiments described above allow for elimination of the MCPCB. For example, mechanical support can be provided by a bottom plate (which can be made of thermally conductive materials, such as copper or other metals, graphite or graphene, and/or other thermally conductive materials). External electrical connections can be provided by peripheral contact pads on the top side of the substrate. In some embodiments, the peripheral contact pads can be designed to balance thermal stress associated with the bottom plate. A cover member can be provided to protect the substrate and to facilitate electrical connections to the peripheral contact pads. Where the MCPCB is eliminated, manufacturing cost saving and reduced form factors can be achieved.

In addition, the bottom plate can provide very efficient thermal transfer to a heat sink or other heat dissipation system, in some instances exceeding the thermal transfer performance of packages that use MCPCBs. The bottom plate can also act to spread heat generated locally within the substrate (e.g., within the metal traces), reducing the occurrence of hot spots that can limit device performance. Thermal resistance in some embodiments can be reduced by 50% or more relative to conventional packages. In some embodiments, packages described herein may allow an LED-based lighting device to operate at higher current (and therefore higher brightness) than has previously been possible.

While the invention has been described with respect to specific embodiments, one skilled in the art will recognize that numerous modifications are possible. For instance, all specific dimensions and materials identified herein are illustrative and not limiting, and drawings are not intended to be to scale.

Packages as described herein can be manufactured using conventional or other techniques. For example, a substrate can be formed by applying metal in desired patterns to layers of a ceramic material, then aligning and co-firing the layers to fuse them into a substrate, after which vias can be formed to interconnect metal at different layers. The bottom metal layer and top-side metal contacts can be formed before or after co-firing of the ceramic layers as desired. In some embodiments, interface layers can formed on the top and bottom surfaces of the substrate before co-firing the layers, and thicker metal (or other) layers can be applied after co-firing. LEDs can be attached and connected, e.g., using wire-bonding or the like, after the substrate (including top and bottom metal) has been fabricated.

While substrates formed from layers of ceramic material patterned with metal traces are described, other types of substrates can also be used. For example, some substrates can incorporate highly thermally-conductive materials such as graphite or graphene, e.g., between ceramic layers. The number and electrical connectivity of the LEDs can be varied as desired. In some embodiments, LEDs can be connected so as to form multiple independently-addressable groups of serially-connected LEDs, allowing different operating currents to be supplied to different groups of LEDs, e.g., to facilitate control of the color of output light. The shape and size of the substrate can be varied, e.g., depending on the size, number, and arrangement of LEDs and peripheral contacts.

Any type(s) of LED (broadly understood as any semiconductor device that emits light when a current is applied) can be used, including but not limited to conventional red, green, blue, amber, infrared, and ultraviolet LEDs. Further, different types of LEDs can coexist on the same substrate. Wavelength-shifting material (e.g., phosphor-containing material) may be applied to the surface of an LED, incorporated into the recess and/or optical elements such as a primary lens, or omitted entirely as desired. In addition, light sensors may be incorporated in place of some of the LEDs, and such light sensors might be used to provide feedback for adjusting the light output using automatic or manual control systems. Thus, any type of solid-state light device (including light emitters, light sensors, and/or any combination thereof) can be used in connection with packages described herein.

The cover described herein is also illustrative and can be varied. The cover housing can match the shape of the substrate or any other shape as desired. In some instances, a cover can be customized for a particular lighting application. Any type of connector can be incorporated into the cover, or electrical leads can simply be exposed at one or more sides (or on top) of the cover, allowing wires or the like to be attached. In some embodiments, the package may be supplied as a kit, with the substrate (including top-side contacts and bottom-side plate), LEDs, and lens as one assembled component and the cover as a separate component. A heat sink can be provided separately from the package, and any type of heat sink or other cooling technology can be used with the packages described herein.

Further, all materials, processes, and tools described herein are also merely examples and can be varied. For example, the particular metal sub-layers herein can be replaced or augmented with other electrically conductive materials, and more or fewer sub-layers could be used. Different processing techniques can be employed. In addition, all dimensions stated herein are for purposes of illustration and can be varied as desired.

The overall form factor of substrates or packages may be varied from the examples shown herein. Packages can be larger or smaller and need not be square in area; rectangular, circular, or other shapes can be substituted. Substrate thickness can also be varied; the recess can be varied in size and shape (or omitted entirely), and other form-factor modifications can be made.

In some embodiments, a package can include a primary lens or other refractive media and/or optically transparent media overlying and protecting the LEDs on the substrate. A packages can be incorporated into a lamp having any desired form factor; for example, using the compact substrates described herein, a lamp can be sized and shaped as a replacement for existing incandescent, halogen, or compact fluorescent light bulbs. Entirely new form factors are also contemplated. A lamp can incorporate a heat sink and/or any other thermal management structures that may be desirable to keep the bottom surface of the substrate sufficiently cool, i.e., at a temperature that provides safe operation of the LEDs given the intended device power.

Thus, although the invention has been described with respect to specific embodiments, it will be appreciated that the invention is intended to cover all modifications and equivalents within the scope of the following claims.

What is claimed is:

1. A light device package comprising:
   a substrate having a top surface that includes a recess region, the recess region having a plurality of LED contact pads disposed therein for connecting one or more light-emitting diodes (LEDs);
   a thick supporting plate disposed over at least a portion of the bottom surface of the substrate; and
   a plurality of peripheral contact pads disposed on an outer area of the top surface of the substrate outside a perimeter of the recess region, the peripheral contact pads being electrically connected to the one or more LED contact pads,
   wherein the thick supporting plate and the peripheral contact pads each include:
      an interface layer comprising a plurality of sub-layers of different metals, the plurality of sub-layers including at least a tungsten sub-layer and a nickel sub-layer; and
      a copper layer,
      wherein the interface layer is disposed directly on the surface of the substrate and the copper layer is disposed directly on the interface layer.

2. The light device package of claim 1 wherein the substrate includes:

a plurality of ceramic layers; and
a plurality of metal traces disposed between the ceramic layers,
wherein the metal traces provide electrical connections between the peripheral contact pads and the LED contact pads.

3. The light device package of claim 1 wherein the thick supporting plate and the peripheral contact pads have approximately the same thickness.

4. The light device package of claim 1 wherein the thick supporting plate is made of metal.

5. A light device package comprising:
a substrate having a top surface that includes a recess region, the recess region having a plurality of LED contact pads disposed therein for connecting one or more light-emitting diodes (LEDs);
a thick supporting plate disposed over at least a portion of the bottom surface of the substrate;
a plurality of peripheral contact pads disposed on an outer area of the top surface of the substrate outside a perimeter of the recess region, the peripheral contact pads being electrically connected to the one or more LED contact pads; and
a cover member, the cover member including:
a housing shaped to fit over the top surface and side surfaces of the substrate, the housing having an opening that is positioned over the recess region when the housing is placed over the top surface and side surfaces of the substrate;
a plurality of metal contact members attached to an underside of the housing, the metal contact members arranged such that a portion of each metal contact member is held in contact with one of the peripheral contact pads when the housing is placed over the top surface and side surfaces of the substrate; and
an electrical connector disposed at a peripheral edge of the housing, wherein the metal contact members are electrically connected to the electrical connector.

6. The light device package of claim 5 wherein the housing is made of an electrically insulating material.

7. The light device package of claim 5 wherein the housing is made of a plastic.

8. The light device package of claim 1 wherein the thick supporting plate has a plurality of grooves disposed therein, each of the plurality of grooves terminating at a peripheral edge of the thick supporting plate.

9. The light device package of claim 1 wherein the bottom surface of the substrate has a square shape and the thick supporting plate has a circular shape.

10. The light device package of claim 1 further comprising a plurality of LEDs disposed in the recess region of the substrate and connected to the LED contact pads.

11. A light device assembly comprising:
a light device package having:
a substrate having a top surface that includes a recess region, the recess region having one or more light-emitting diodes (LEDs) disposed therein;
a bottom supporting plate disposed over at least a portion of the bottom surface of the substrate; and
a plurality of peripheral contact pads disposed on a top surface of the substrate outside a perimeter of the recess region, the peripheral contact pads being electrically connected to the LEDs via electrically conductive pathways through the substrate;
a heat sink,
wherein the bottom supporting plate is attached to the heat sink; and
a cover member, the cover member including:
a housing shaped to fit over the top surface and side surfaces of the substrate, the housing having an opening that is positioned over the recess region when the housing is placed over the top surface and side surfaces of the substrate;
a plurality of metal contact members attached to an underside of the housing, the metal contact members arranged such that a portion of each metal contact member is held in contact with one of the peripheral contact pads when the housing is placed over the top surface and side surfaces of the substrate; and
an electrical connector disposed at a peripheral edge of the housing, wherein the metal contact members are electrically connected to the electrical connector.

12. The light device assembly of claim 11 wherein the bottom supporting plate is attached to the heat sink by a thermally conductive adhesive material.

13. The light device assembly of claim 11 wherein the bottom supporting plate is attached to the heat sink by a solder material.

14. The light device assembly of claim 11 wherein the bottom supporting plate is configured to provide mechanical support for the substrate and to provide heat transfer to the heat sink without an intervening MCPCB (metal core printed circuit board).

15. The light device assembly of claim 11 wherein the housing is attached to the heat sink.

16. A light device package comprising:
a substrate having a top surface that includes a recess region;
a plurality of LED contact pads disposed in the recess region of the top surface for connecting one or more light-emitting diodes (LEDs);
a plurality of peripheral metal contact pads electrically connected to the plurality of LED contact pads;
a plurality of LEDs, each LED being disposed on one of the plurality of LED contact pads;
a metal supporting plate disposed over at least a portion of a bottom surface of the substrate; and
a cover member disposed over the top surface of the substrate, the cover member having an opening therethrough to emit light from the plurality of LEDs, the cover member including:
a housing shaped to fit over the top surface and side surfaces of the substrate, the housing having an opening that is positioned over the recess region when the housing is placed over the top surface and side surfaces of the substrate;
a plurality of metal contact members attached to an underside of the housing, the metal contact members arranged such that a portion of each metal contact member is held in contact with one of the peripheral contact pads when the housing is placed over the top surface and side surfaces of the substrate; and
an electrical connector disposed at a peripheral edge of the housing, wherein the metal contact members are electrically connected to the electrical connector.

17. The light device package of claim 16 wherein the metal supporting plate and the peripheral metal contact pads have approximately the same thickness of about 25-40 µm.

18. The light device package of claim 17 wherein the metal supporting plate and the peripheral metal contact pads are made of the same material.

* * * * *